(12) United States Patent
Ilchenko et al.

(10) Patent No.: US 11,656,268 B2
(45) Date of Patent: May 23, 2023

(54) APPARATUS AND METHOD FOR TESTING COUPLED AC CIRCUIT

(71) Applicant: GM Cruise Holdings LLC, San Francisco, CA (US)

(72) Inventors: Vladimir Ilchenko, Arcadia, CA (US); Ayan Chakrabarty, Glendora, CA (US); Scott Singer, San Gabriel, CA (US); Richard Kalantar Ohanian, Glendale, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 679 days.

(21) Appl. No.: 16/731,727

(22) Filed: Dec. 31, 2019

(65) Prior Publication Data

US 2021/0199782 A1 Jul. 1, 2021

(51) Int. Cl.
*G01R 31/28* (2006.01)
*G01S 7/481* (2006.01)
*G01R 31/00* (2006.01)
*G01R 23/163* (2006.01)

(52) U.S. Cl.
CPC ....... *G01R 31/2824* (2013.01); *G01R 23/163* (2013.01); *G01R 31/002* (2013.01); *G01S 7/4818* (2013.01)

(58) Field of Classification Search
CPC ............... G01R 31/002; G01R 23/163; G01R 31/2824; G01S 7/497; G01S 7/4818
See application file for complete search history.

(56) References Cited

U.S. PATENT DOCUMENTS

| 11,353,558 | B2 * | 6/2022 | Maleki | G01S 17/34 |
| 2011/0091204 | A1 * | 4/2011 | Doran | H04B 10/677 398/25 |
| 2013/0003766 | A1 * | 1/2013 | Savchenkov | H01S 5/142 372/32 |
| 2014/0078514 | A1 * | 3/2014 | Zhu | G01S 17/10 356/606 |
| 2020/0105958 | A1 * | 4/2020 | Sasago | H01L 27/1461 |
| 2020/0203916 | A1 * | 6/2020 | Iguchi | H01S 3/08013 |
| 2020/0271784 | A1 * | 8/2020 | Bradford | G01S 17/88 |

\* cited by examiner

*Primary Examiner* — Jeff W Natalini
(74) *Attorney, Agent, or Firm* — Calfee, Halter & Griswold LLP

(57) ABSTRACT

Various technologies described herein pertain to a testing apparatus that enables an analog frequency response of a device under test to be analyzed. The testing apparatus includes a laser source and an optical resonator. The laser source is optically injection locked to the optical resonator. The testing apparatus also includes a modulator configured to apply a time-varying voltage to the optical resonator. The time-varying voltage causes the laser source optically injection locked to the optical resonator to generate a frequency modulated optical signal that can include time-varying chirps. The testing apparatus further includes an interferometer (e.g., variable delay, fixed length) configured to receive the frequency modulated optical signal from the laser source optically injection locked to the optical resonator. The interferometer outputs an optical test signal having a range of frequencies. The frequencies in the optical test signal are based at least in part on the time-varying chirps.

20 Claims, 9 Drawing Sheets

US 11,656,268 B2

APPARATUS AND METHOD FOR TESTING COUPLED AC CIRCUIT

BACKGROUND

Light detection and ranging (lidar) systems are surveying systems that measure distance to a target in an environment by illuminating the target with laser light and measuring reflected light (lidar return). Differences in laser return times can be utilized to generate a three-dimensional (3D) representation of the target. Lidar systems can also be used to measure the velocity of the target with respect to the observer. Thus, lidar systems can be used in various terrestrial, airborne, and mobile applications; for instance, lidar systems can be employed in autonomous or semi-autonomous vehicles, drones, robotics, and other applications that utilize laser scanning capabilities.

When designing a lidar system, it is often desirable to test analog frequency responses of various alternating current (AC) circuits that potentially may be integrated into the lidar system. However, it typically is desirable to test such circuits before integrating them into the overall lidar system. Further, it may be desirable to be able to test the analog frequency responses of the AC circuits in a lab or other controlled environment.

A conventional approach for generating test signals utilizes a laser source and an interferometer, where the laser source provides a single frequency light beam to the interferometer. Such conventional approaches typically output an optical signal having a single frequency (or a few discrete frequency points). However, these conventional approaches may be difficult to use to investigate frequency responses of an AC circuit over a spectrum of frequencies.

SUMMARY

The following is a brief summary of subject matter that is described in greater detail herein. This summary is not intended to be limiting as to the scope of the claims.

Described herein are various technologies that pertain to a testing apparatus. The testing apparatus can enable an analog frequency response of a device under test (e.g., an AC circuit) coupled to the testing apparatus to be analyzed. For instance, the testing apparatus and the device under test can be optically coupled or electrically coupled (e.g., an optical test signal or an electrical test signal can be outputted from the testing apparatus). The testing apparatus can include a laser source and an optical resonator that is optically coupled to the laser source. The optical resonator can be formed of an electrooptic material. Further, the laser source can be optically injection locked to the optical resonator. Moreover, the testing apparatus can include a modulator configured to apply a time-varying voltage to the optical resonator. The time-varying voltage can control modulation of an optical property of the electrooptic material to cause the laser source optically injection locked to the optical resonator to generate a frequency modulated optical signal. The frequency modulated optical signal can include time-varying chirps. The testing apparatus can also include an interferometer. The interferometer can be configured to receive the frequency modulated optical signal from the laser source optically injection locked to the optical resonator. The interferometer can further be configured to output an optical test signal having a range of frequencies. The frequencies in the optical test signal can be based at least in part on the time-varying chirps. Pursuant to an example, the interferometer can be a variable delay interferometer. According to another example, the interferometer can be a fixed length interferometer.

According to various embodiments, the interferometer can include a first beam splitter, a second beam splitter, a first optical path, and a second optical path. The first optical path can be between the first beam splitter and the second beam splitter. Likewise, the second optical path can be between the first beam splitter and the second beam splitter. The first beam splitter can be configured to split the frequency modulated optical signal received from the laser source optically injection locked to the optical resonator into a first portion of the frequency modulated optical signal and a second portion of the frequency modulated optical signal. The first portion of the frequency modulated optical signal can propagate from the first beam splitter to the second beam splitter via the first optical path. Moreover, the second portion of the frequency modulated optical signal can propagate from the first beam splitter to the second beam splitter via the second optical path such that receipt of the second portion of the frequency modulated optical signal at the second beam splitter is delayed relative to receipt of the first portion of the frequency modulated optical signal at the second beam splitter. Further, the second beam splitter can be configured to combine the first portion of the frequency modulated optical signal and the second portion of the frequency modulated optical signal as delayed to output the optical test signal.

Pursuant to various embodiments, the interferometer can be a variable delay interferometer that can include a plurality of optical delay paths between the first beam splitter and the second beam splitter, where each optical delay path is configured to cause a respective corresponding delay for an optical signal propagating there through. The second optical path through which the second portion of the frequency modulated optical signal propagates can be one of the optical delay paths. Thus, one of the optical delay paths can be used as the second optical path during a particular time period, and a different one of the optical delay paths can be used as the second optical path during a differing time period to generate optical test signals having different ranges of frequencies during the different time periods. In accordance with an example, the plurality of optical delay paths can be a plurality of fibers of different lengths. According to another example, the plurality of optical delay paths can be a plurality of fibers formed of different types of materials. Pursuant to yet another example, mirrors can be utilized to provide the plurality of optical delay paths.

According to various embodiments, the optical test signal generated by the interferometer can be outputted from the testing apparatus such that the optical test signal is operable to be inputted to a device under test (e.g., to analyze analog frequency response of an optically coupled AC circuit). Pursuant to other embodiments, the testing apparatus can further include a signal converter configured to receive the optical test signal from the interferometer. In accordance with such embodiments, the signal converter can further be configured to convert the optical test signal to an electrical test signal. Moreover, the electrical test signal can be outputted from the testing apparatus such that the electrical test signal is operable to be inputted to a device under test (e.g., to analyze analog frequency response of an electrically coupled AC circuit).

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
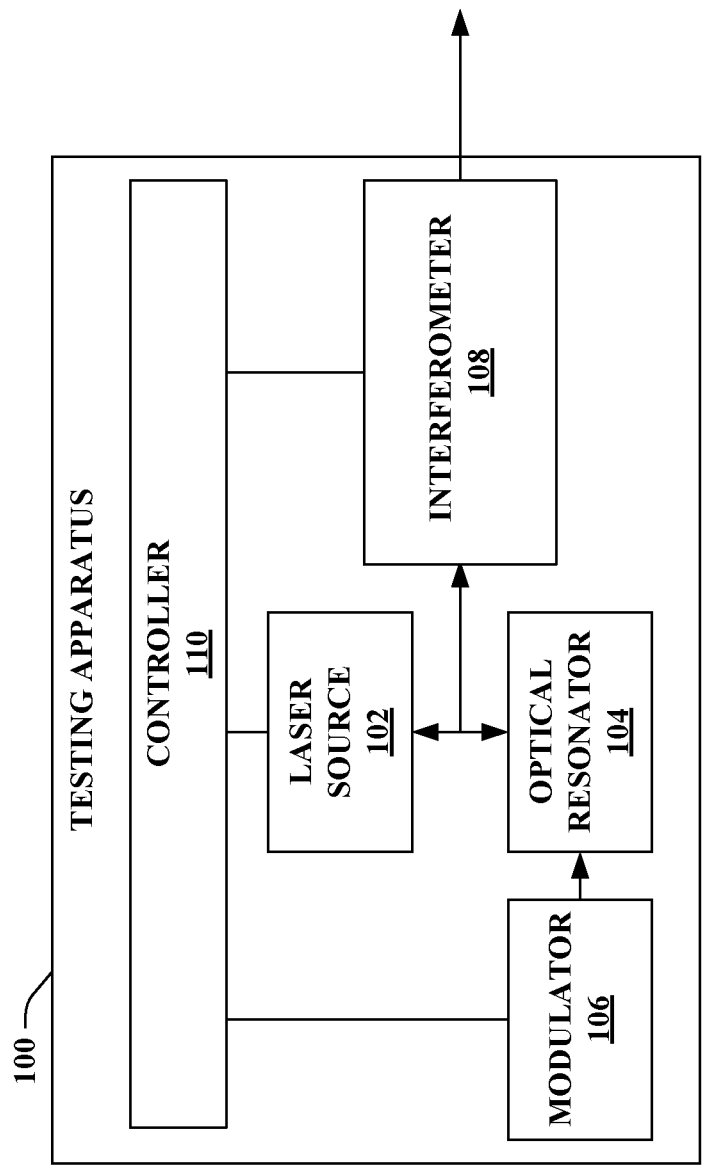
FIG. 1 illustrates a functional block diagram of an exemplary testing apparatus that enables an analog frequency response of a device under test coupled to the testing apparatus to be analyzed.

Various technologies pertaining to testing apparatuses and methods for analyzing analog frequency responses of devices under test are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Further, as used herein, the term "exemplary" is intended to mean "serving as an illustration or example of something."

Referring now to the drawings, FIG. 1 illustrates a testing apparatus 100. The testing apparatus 100 can enable an analog frequency response of a device under test (e.g., an AC circuit) coupled to the testing apparatus 100 to be analyzed. For instance, the testing apparatus 100 and the device under test can be optically coupled or electrically coupled (e.g., an optical test signal or an electrical test signal can be outputted from the testing apparatus 100). The testing apparatus 100 includes a laser source 102. The laser source 102 can be a semiconductor laser, a laser diode, or the like. It is contemplated that the laser source 102 can operate at substantially any wavelength (e.g., 1550 nm, 905 nm, etc.).

The testing apparatus 100 further includes an optical resonator 104. The optical resonator 104 can be a whispering gallery mode (WGM) resonator (e.g., a high quality factor (Q) WGM resonator). The optical resonator 104 is formed of an electrooptic material. Examples of the electrooptic material include lithium niobate, lithium tantalate, calcium fluoride, magnesium fluoride, silicon, and so forth. The optical resonator 104 can include an electrode (or electrodes) to which a voltage can be applied. Application of a voltage to the optical resonator 104 can change an optical property of the electrooptic material of the optical resonator 104. For instance, application of a voltage can change an index of refraction of the electrooptic material of the optical resonator 104.

The optical resonator 104 is optically coupled to the laser source 102. A light beam emitted from the laser source 102 is provided to the optical resonator 104, circulates inside the optical resonator 104 undergoing total internal reflection, and is provided back from the optical resonator 104 to the laser source 102. Accordingly, the laser source 102 is optically injection locked to the optical resonator 104. Since the laser source 102 is optically injection locked to the optical resonator 104, a voltage applied to the optical resonator 104 can impart a frequency change on the laser source 102. Due to electrooptic properties and size of the optical resonator 104, frequency of the optical resonator 104 can be linearly modulated with a relatively narrow linewidth. Accordingly, optical signals outputted by the laser source 102 optically injection locked to the optical resonator 104 can have low noise characteristics.

Moreover, the testing apparatus 100 can include a modulator 106 configured to apply a time-varying voltage to the optical resonator 104. The time-varying voltage can control modulation of an optical property of the electrooptic material (e.g., the index of refraction) of the optical resonator 104 to cause the laser source 102 to generate a frequency modulated optical signal comprising a series of optical chirps. Thus, the time-varying voltage can control modulation of the optical property of the electrooptic material to cause the laser source 102 optically injection locked to the optical resonator 104 to generate a frequency modulated optical signal. Further, the frequency modulated optical signal can comprise time-varying chirps (e.g., the modulation can be modulated such that chirps change over time). Accordingly, frequencies of the optical signal outputted by the laser source 102 optically injection locked to the optical resonator 104 can be a function of voltages applied by the modulator 106 to the optical resonator 104 over time.

The testing apparatus 100 also includes an interferometer 108. The interferometer 108 is configured to receive the frequency modulated optical signal from the laser source 102 optically injection locked to the optical resonator 104. The interferometer 108 splits the frequency modulated optical signal into two beams that travel in different optical paths; the two beams are then combined. The interferometer 108 is further configured to output an optical test signal having a range of frequencies. The frequencies in the optical test signal can be based at least in part on the time-varying chirps included in the frequency modulated optical signal. According to various examples, the interferometer 108 can be a variable delay interferometer. Pursuant to other examples, the interferometer 108 can be a fixed length interferometer (e.g., providing a fixed propagation delay of a portion of the frequency modulated optical signal relative to another portion of the frequency modulated optical signal).

The frequencies in the optical test signal outputted by the interferometer 108 can also be based on a propagation delay of a portion of the frequency modulated optical signal caused by the interferometer 108. The interferometer 108 can be a variable delay interferometer that can include a plurality of optical delay paths; each optical delay path is configured to cause a respective corresponding delay for an optical signal propagating there through. Thus, one of the optical delay paths can be used during a particular time period, and a different one of the optical delay paths can be used during a differing time period to generate optical test signals having different ranges of frequencies during the different time periods. In accordance with an example, the plurality of optical delay paths can be a plurality of fibers of different lengths. According to another example, the plurality of optical delay paths can be a plurality of fibers formed of different types of materials (e.g., an optical signal passes through the different types of materials at different speeds). Pursuant to yet another example, mirrors can be utilized to provide the plurality of optical delay paths.

As noted above, the frequencies in the optical test signal can be based on the propagation delay of the portion of the frequency modulated optical signal. According to an illustration, the interferometer 108 (e.g., the variable delay interferometer) can include fibers of different lengths. Following this illustration, the portion of the frequency modulated optical signal can propagate through one of the fibers; thus, the propagation delay can be based on a length of the fiber through which the portion of the frequency modulated optical signal propagates. In accordance with another illustration, the interferometer 108 (e.g., the variable delay interferometer) can include fibers formed of different types of material. Pursuant to this illustration, the portion of the frequency modulated optical signal can propagate through one of the fibers; accordingly, the propagation delay can be based on a type of the material of the fiber through which the portion of the frequency modulated optical signal propagates.

The testing apparatus 100 can also include a controller 110. The controller 110 can be operatively coupled with the laser source 102, the modulator 106, and/or the interferometer 108. The controller 110, for instance, can control the modulator 106 to apply the time-varying voltage to the optical resonator 104. The controller 110 can control timing, waveform shape, or the like of the time-varying voltage. By way of example, the controller 110 can control the modulator 106 to apply a continuous wave sawtooth waveform, a continuous wave triangular waveform, a pulsed triangular waveform, a continuous wave sigmoid-shaped waveform, or the like. Further, the controller 110 can change the waveform shape or properties of a particular waveform shape over time (e.g., a voltage change of a chirp can be modified over time, a period of a chirp can be modified over time).

Moreover, in various embodiments, the controller 110 can be configured to selectively control operating parameters of the laser source 102. For instance, the controller 110 can control a power level of the laser source 102. By changing the power level of the laser source 102, an intensity response of a device under test can be evaluated. In other embodiments, however, it is contemplated that in-line attenuation can additionally or alternatively be employed to enable evaluating the intensity response of the device under test (e.g., the testing apparatus 100 can include an attenuator to reduce a power level of the optical test signal and/or an electrical test signal inputted to the device under test).

It is further contemplated that the controller 110 can control the interferometer 108 in various embodiments. As noted above, the interferometer 108 can be a variable delay interferometer that can include a plurality of optical delay paths. The controller 110 can cause a particular one of the optical delay paths to be utilized for generating the optical test signal for a particular period of time. Thus, the controller 110 can enable switching between the optical delay paths over time.

The testing apparatus 100 can be comprised in a housing. Accordingly, elements described herein in various examples as being part of the testing apparatus 100 can be housed within the housing. For instance, the housing can be rack-mountable.

Figure 2:
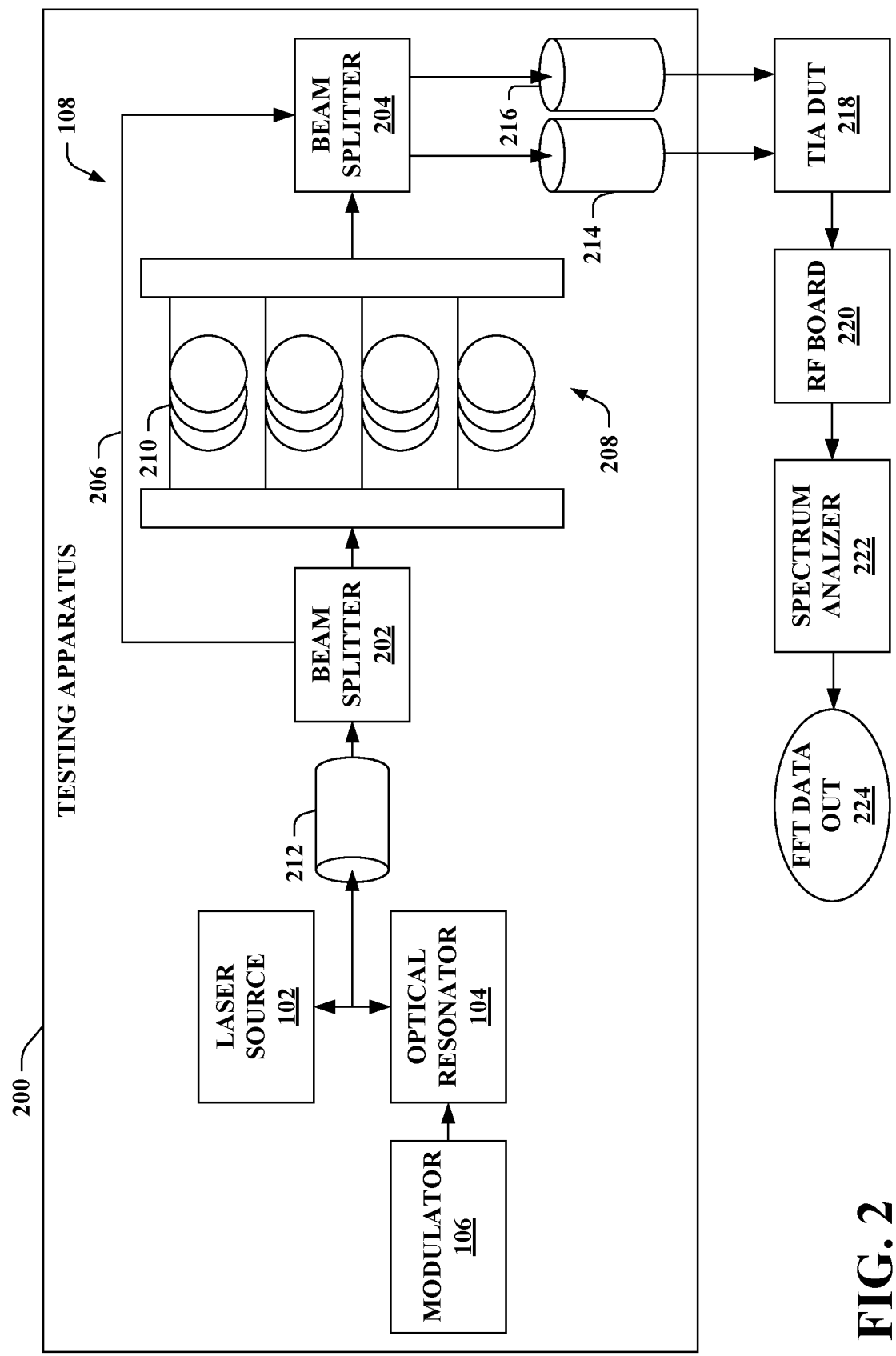
FIG. 2 illustrates a functional block diagram of another exemplary testing apparatus.

Now turning to FIG. 2, illustrated is an exemplary testing apparatus 200 (e.g., the testing apparatus 100 of FIG. 1). The testing apparatus 200 includes the laser source 102, the optical resonator 104, the modulator 106, and the interferometer 108. As described above, the laser source 102 is optically injection locked to the optical resonator 104, and the modulator 106 is configured to apply a time-varying voltage to the optical resonator 104. The time-varying voltage causes the laser source 102 optically injection locked to the optical resonator 104 to generate a frequency modulated optical signal, which is received by the interferometer 108. Although not shown in FIG. 2, it is to be appreciated that the testing apparatus 200 can also include the controller 110.

The interferometer 108 depicted in FIG. 2 is a variable delay interferometer that includes a first beam splitter 202, a second beam splitter 204, a first optical path 206, and a plurality of optical delay paths 208. The first optical path 206 is between the first beam splitter 202 and the second beam splitter 204. The plurality of optical delay paths 208 are likewise between the first beam splitter 202 and the second beam splitter 204. In the example of FIG. 2, the plurality of optical delay paths 208 are a plurality of fibers. The fibers can have differing lengths and/or can be formed from different types of materials.

The first beam splitter 202 is configured to split the frequency modulated optical signal into a first portion of the frequency modulated optical signal and a second portion of the frequency modulated optical signal (e.g., the frequency modulated optical signal is split into two beams). According to the depicted example, the first beam splitter 202 can be a 1×2 beam splitter (e.g., one beam is inputted into the first beam splitter 202 and two beams are outputted out of the first beam splitter 202). The first beam splitter 202 can split the frequency modulated optical signal such that the first portion of the frequency modulated optical signal and the second portion of the frequency modulated optical signal are each at approximately 50% of the power of the frequency modulated optical signal inputted to the first beam splitter 202. However, the first beam splitter 202 need not equally divide the power of the frequency modulated optical signal in other embodiments.

The first portion of the frequency modulated optical signal (e.g., a first beam) can propagate from the first beam splitter 202 to the second beam splitter 204 via the first optical path 206. Moreover, one of the plurality of optical delay paths 208 can be a second optical path (e.g., during a particular period of time, the optical delay path from the optical delay paths 208 used as the second optical path can change to alter a delay). Accordingly, the second portion of the frequency modulated optical signal (e.g., a second beam) can propagate from the first beam splitter 202 to the second beam splitter 204 via the second optical path. By way of example, an optical delay path 210 from the plurality of optical delay paths 208 can be the second optical path during a particular period of time (also referred to herein as the second optical path 210). The optical delay path 210 can be selected from the plurality of optical delay paths 208 as the second optical path. While the optical delay path 210 is described as being the second optical path in many of the examples set forth herein, it is contemplated that these examples can be extended to the other optical delay paths 208 alternatively being the second optical path (e.g., during a given period of time).

Further, the optical delay paths 208 can delay a beam propagating there through as compared to the first optical path 206. Each optical delay path 208 is configured to cause a respective corresponding delay for an optical signal propagating there through. Accordingly, the second portion of the frequency modulated optical signal propagates from the first beam splitter 202 to the second beam splitter 204 via the second optical path 210 such that receipt of the second portion of the frequency modulated optical signal at the second beam splitter 204 is delayed relative to receipt of the first portion of the frequency modulated optical signal at the second beam splitter 204 (e.g., the first portion propagates via the first optical path 206).

As shown in the example of FIG. 2, the optical delay paths 208 can include four fibers. Moreover, the fibers can be coiled to allow for maintaining a relative compact size of the testing apparatus 200. For instance, a particular fiber from the plurality of fibers can be selected as the second optical path (e.g., for a particular period of time). According to an example, the fibers (e.g., the optical delay paths 208) can have different lengths. Pursuant to an illustration, the fibers can include a first fiber having a length of 25 m, a second fiber having a length of 50 m, a third fiber having a length of 100 m, and a fourth fiber having a length of 200 m; yet, other fiber lengths are intended to fall within the scope of the hereto appended claims. Pursuant to another example, the fibers (e.g., the optical delay paths 208) can be formed of differing types of material. In accordance with yet another example, the fibers can have different lengths and can be formed of differing types of materials. Moreover, it is contemplated that more than or less than four fibers can alternatively be included in the interferometer 108 (e.g., the interferometer 108 can include one fiber and thus can be a fixed length interferometer). It is also to be appreciated that mirrors can alternatively be used to provide the optical delay paths 208.

The second beam splitter 204 is configured to combine the first portion of the frequency modulated optical signal and the second portion of the frequency modulated optical signal as delayed to output an optical test signal. In various embodiments, the second beam splitter 204 can be a 2×2 beam splitter. Accordingly, the second beam splitter 204 can be configured to combine the first portion of the frequency modulated optical signal and the second portion of the frequency modulated optical signal as delayed to generate an optical test signal. The second beam splitter 204 can split the optical test signal into a first portion of the optical test signal and a second portion of the optical test signal such that the first portion and the second portion of the optical test signal are outputted by the second beam splitter 204.

Moreover, the testing apparatus 200 (e.g., the interferometer 108) can include a fiber input 212 and two fiber outputs, namely, a fiber output 214 and a fiber output 216. The fiber input 212 can be a connector between the laser source 102 optically injection locked to the optical resonator 104 and the beam splitter 202. For instance, the frequency modulated optical signal generated by the laser source 102 optically injection locked to the optical resonator 104 can be in free space. The frequency modulated optical signal can be incident on an end of the fiber input 212. It is also contemplated that a collimator or some other type of optical element can take the frequency modulated optical signal from free space and input the frequency modulated optical signal into an end of the fiber input 212.

As noted above, the second beam splitter 204 can split the optical test signal. Thus, the second beam splitter 204 can output the first portion of the optical test signal via the first fiber output 214 and the second portion of the optical test signal via the second fiber output 216. The fiber outputs 214-216 can be at a set spacing. For instance, the fiber outputs 214-216 can be laterally offset on the order of 350 μm. Moreover, the fiber outputs 214-216 can be aligned. According to an example, the fiber outputs 214-216 can be oriented vertically to output to the optical test signal from the testing apparatus 200. The fiber outputs 214-216 provide a phase delay, which enables mitigating a direct current (DC) part of the optical test signal (which can mitigate saturation of component(s) of the device under test).

In the example set forth in FIG. 2, the testing apparatus 200 is configured to output the optical test signal (e.g., via the fiber outputs 214-216). The optical test signal can be outputted from the testing apparatus 200 such that the optical test signal is operable to be inputted to a device under test. As shown in the example of FIG. 2, the optical test signal from the testing apparatus 200 can be inputted to a transimpedance amplifier (TIA) device under test (DUT) 218. According to an example, the transimpedance amplifier device under test 218 can generate a voltage signal responsive to the optical test signal received from the testing apparatus 200. The voltage signal from the transimpedance amplifier device under test 218 can be inputted to a radio frequency (RF) board 220 (e.g., an RF circuit). Moreover, an output of the radio frequency board 220 can be inputted to a spectrum analyzer 222, which can generate a Fast Fourier Transform (FFT) data output 224.

The testing apparatus 200 enables an analog frequency response of an optically coupled AC circuit (e.g., the transimpedance amplifier device under test 218) to be analyzed using the low noise, frequency modulated laser source 102 (optically injection locked to the optical resonator 204) and the interferometer 108. Moreover, alignment onto photodiodes (e.g., of the optically coupled AC circuit) can be provided via the fiber outputs 214-216. According to an example, modulation of the laser source 102 (as provided by the modulator 106 applying the time-varying voltage to the optical resonator 104) can be altered to provide a continuous spectrum of frequencies in the optical test signal. Further, an intensity response of the optically coupled AC circuit can be evaluated using an in-line attenuator and/or by reducing power of the laser source 102 (e.g., as controlled by the controller 110). The foregoing can allow a lidar return at range to be simulated in the testing apparatus 200 (e.g., in fiber) to test and/or screen receiver circuitry (e.g., the transimpedance amplifier device under test 218) without having to test in an integrated system outside.

Figure 3:
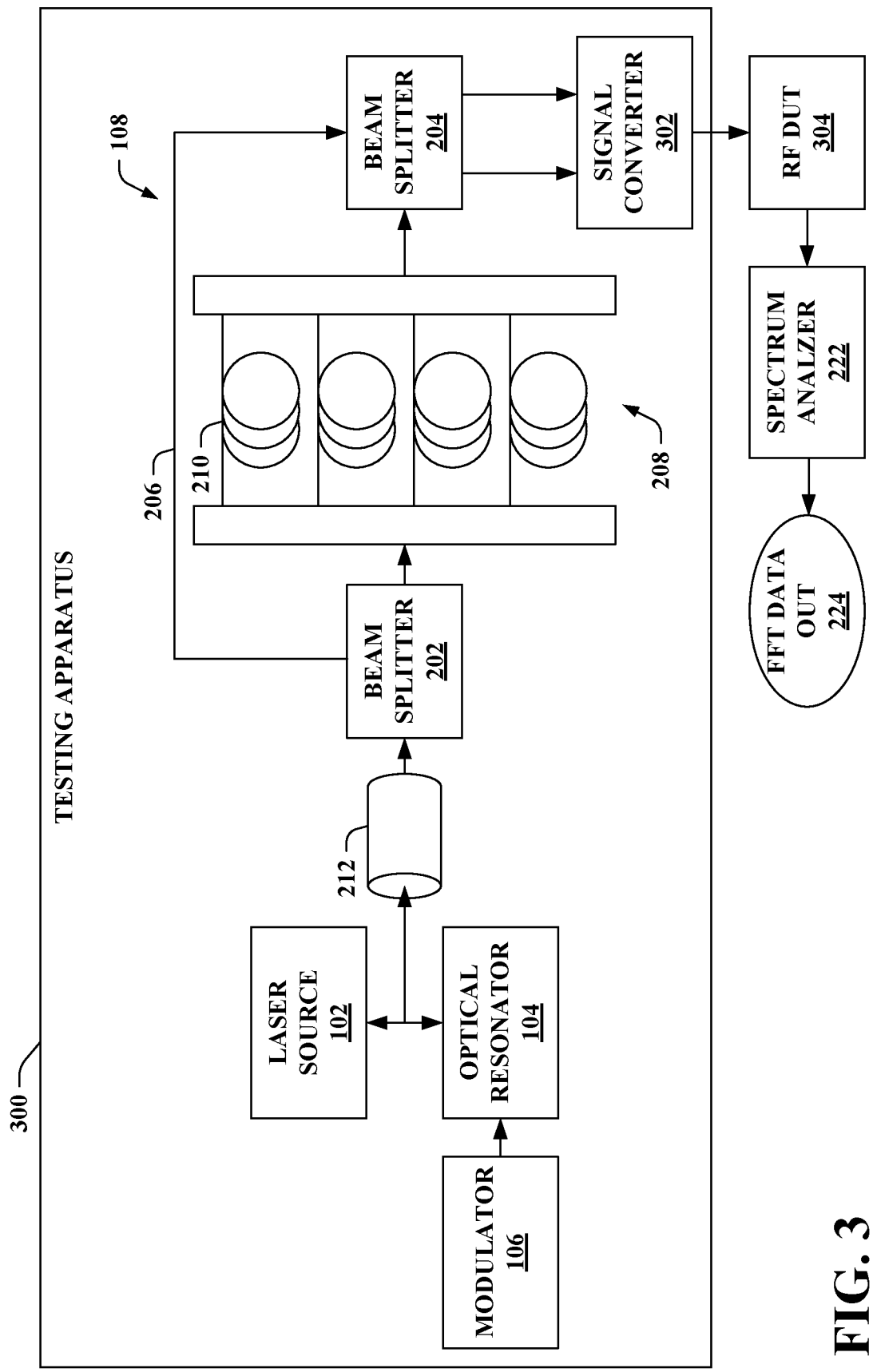
FIG. 3 illustrates a functional block diagram of another exemplary testing apparatus.

With reference to FIG. 3, illustrated is another exemplary testing apparatus 300 (e.g., the testing apparatus 100 of FIG. 1). Again, the testing apparatus 300 includes the laser source 102, the optical resonator 104, the modulator 106, and the interferometer 108. Further, although not shown, it is to be appreciated that the testing apparatus 300 can include the controller 110. Moreover, similar to the example set forth in FIG. 2, the interferometer 108 of the testing apparatus 300 (e.g., a variable delay interferometer) includes the first beam splitter 202, second beam splitter 204, the first optical path 206, and the plurality of optical delay paths 208. The testing apparatus 300 can further include the fiber input 212.

In the example set forth in FIG. 3, the testing apparatus 300 includes a signal converter 302 configured to receive the optical test signal from the interferometer 108 (e.g., from the second beam splitter 204). The signal converter 302 is further configured to convert the optical test signal to an electrical test signal. Pursuant to an example, the signal converter 302 can be a transimpedance amplifier; however, the claimed subject matter is not so limited. The electrical test signal is outputted from the testing apparatus 300 such that the electrical test signal is operable to be inputted to a device under test. Accordingly, as shown, the electrical test signal can be outputted from the testing apparatus 300 and inputted to an RF device under test 304. An output from the RF device under test 304 can be provided to the spectrum analyzer 222, which can generate a Fast Fourier Transform (FFT) data output 224. Thus, the testing apparatus 300 can be utilized to analyze an analog frequency response of an electrically coupled AC circuit (e.g., the RF device under test 304).

Figure 4:
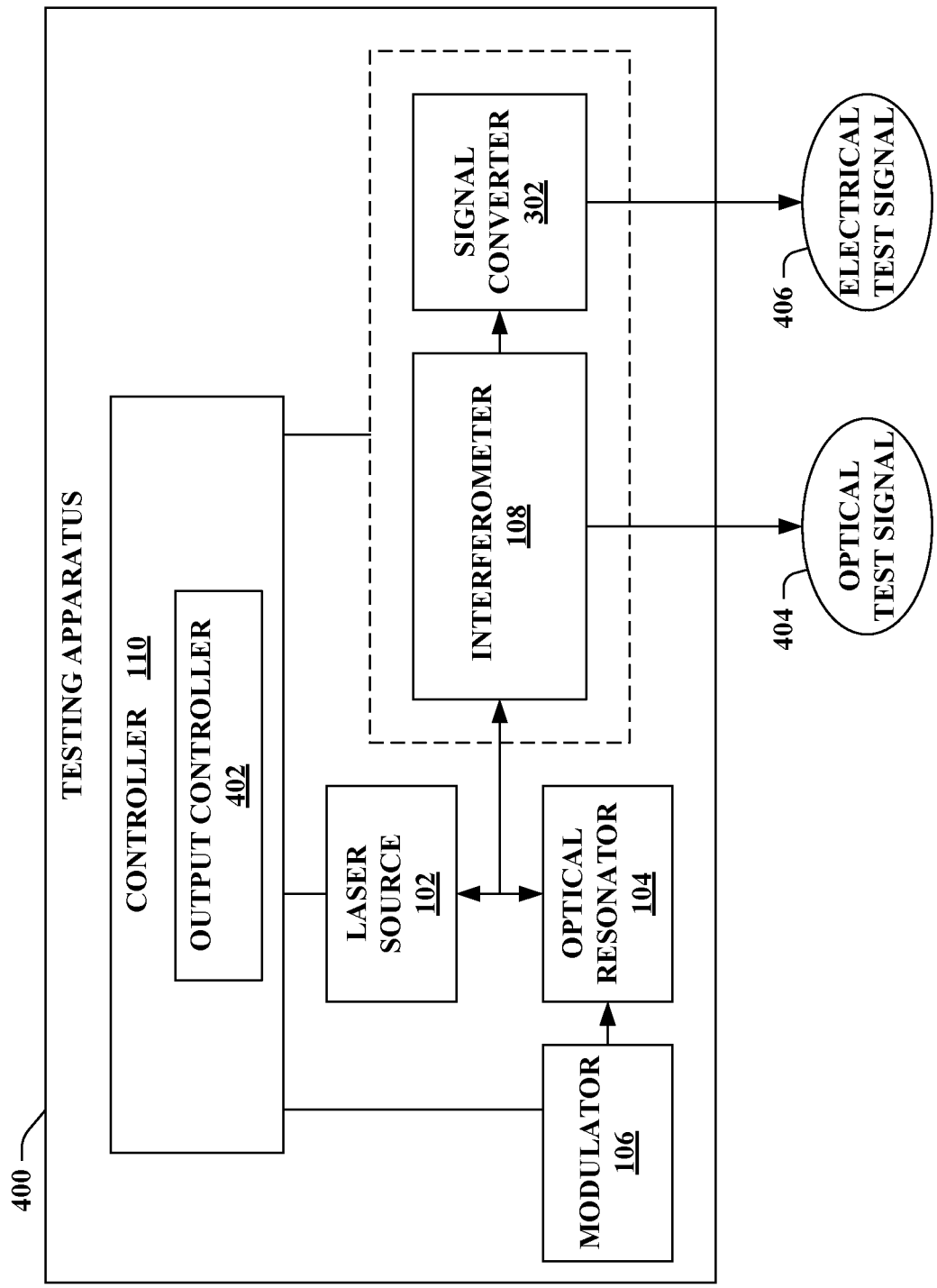
FIG. 4 illustrates a functional block diagram of yet another exemplary testing apparatus.

Now turning to FIG. 4, illustrated is another exemplary testing apparatus 400 (e.g., the testing apparatus 100 of FIG. 1). The testing apparatus 400 again includes the laser source 102, the optical resonator 104, the modulator 106, and the interferometer 108 (e.g., a variable delay interferometer, a fixed length interferometer). Moreover, the testing apparatus 400 includes the controller 110 and the signal converter 302.

As described herein, the interferometer 108 can output an optical test signal. Further, the optical test signal can be inputted to the signal converter 302, which can convert the optical test signal to an electrical test signal. In the example of FIG. 4, the controller 110 can include an output controller 402. The output controller 402 is configured to cause the testing apparatus 400 to switch between outputting an optical test signal 404 (e.g., generated by the interferometer 108) and an electrical test signal 406 (e.g., generated by the signal converter 302).

Figure 5:
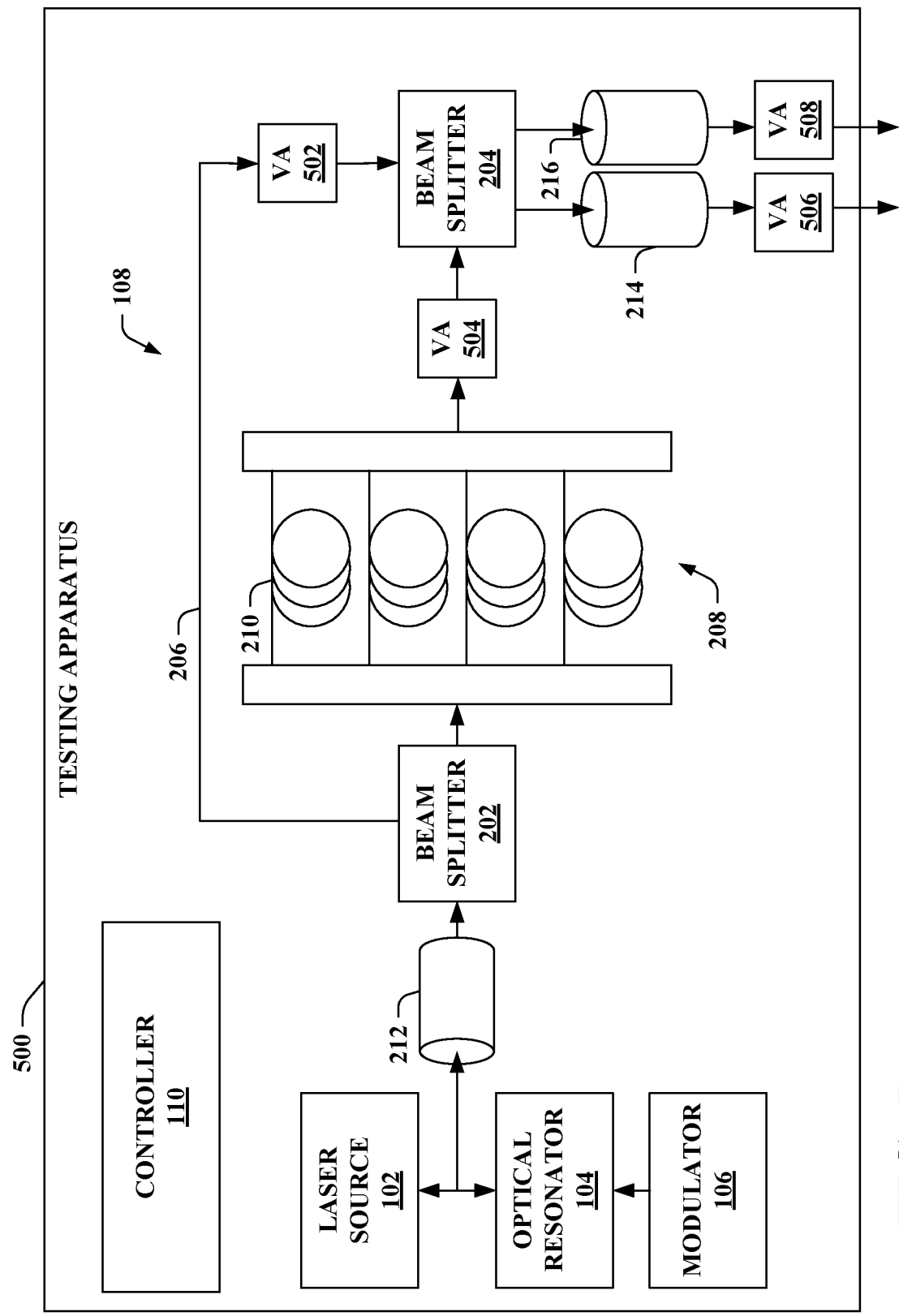
FIG. 5 illustrates a functional block diagram of yet another exemplary testing apparatus that includes one or more variable attenuators.

Referring now to FIG. 5, illustrated is yet another exemplary testing apparatus 500 (e.g., the testing apparatus 100 of FIG. 1). The testing apparatus 500 again includes the laser source 102, the optical resonator 104, the modulator 106, the interferometer 108, and the controller 110. The testing apparatus 500 of FIG. 5 further includes one or more variable attenuators (VAs). In particular, in the example shown, the testing apparatus 500 can include a variable attenuator 502, a variable attenuator 504, a variable attenuator 506, and a variable attenuator 508. It is contemplated that the testing apparatus 500 need not include all of the variable attenuators 502-508 shown in FIG. 5. Additionally or alternatively, the testing apparatus 500 can include other variable attenuator(s). For instance, rather than including the variable attenuator 504 between the plurality of optical delay paths 208 and the second beam splitter 204, each of the optical delay paths 208 can include a respective variable attenuator. According to another illustration, the variable attenuators 506 and 508 can alternatively be between the second beam splitter 204 and the fiber outputs 214-216.

Each of the variable attenuators 502-508 can reduce power of a signal propagating through the respective variable attenuator 502-508. Moreover, a loss caused by each of the variable attenuators 502-508 can be controllable (e.g., to enable analyzing various properties of a device under test coupled to the testing apparatus 500). For example, the controller 110 can control the loss of each of the variable attenuators 502-508; however, the claimed subject matter is not so limited.

The variable attenuators 502-508 can enable analyzing various properties of an AC circuit (e.g., a device under test) coupled to the testing apparatus 500. For example, one or more of the variable attenuators 502-508 can be used to evaluate how a noise floor of an AC circuit is influenced by various components. According to another example, the variable attenuator 502 on the first optical path 206 can be utilized to detect a minimum local oscillator power to be used for the AC circuit. Pursuant to another example, the variable attenuator 504 after the variable delay (e.g., after the optical delay paths) can be employed to provide different power levels of a signal (variable target reflectivity) that can be monitored with the AC circuit. In accordance with another example, the variable attenuators 506 and 508 can be used to test how well photodiodes of the AC circuit are balanced.

Figure 6:
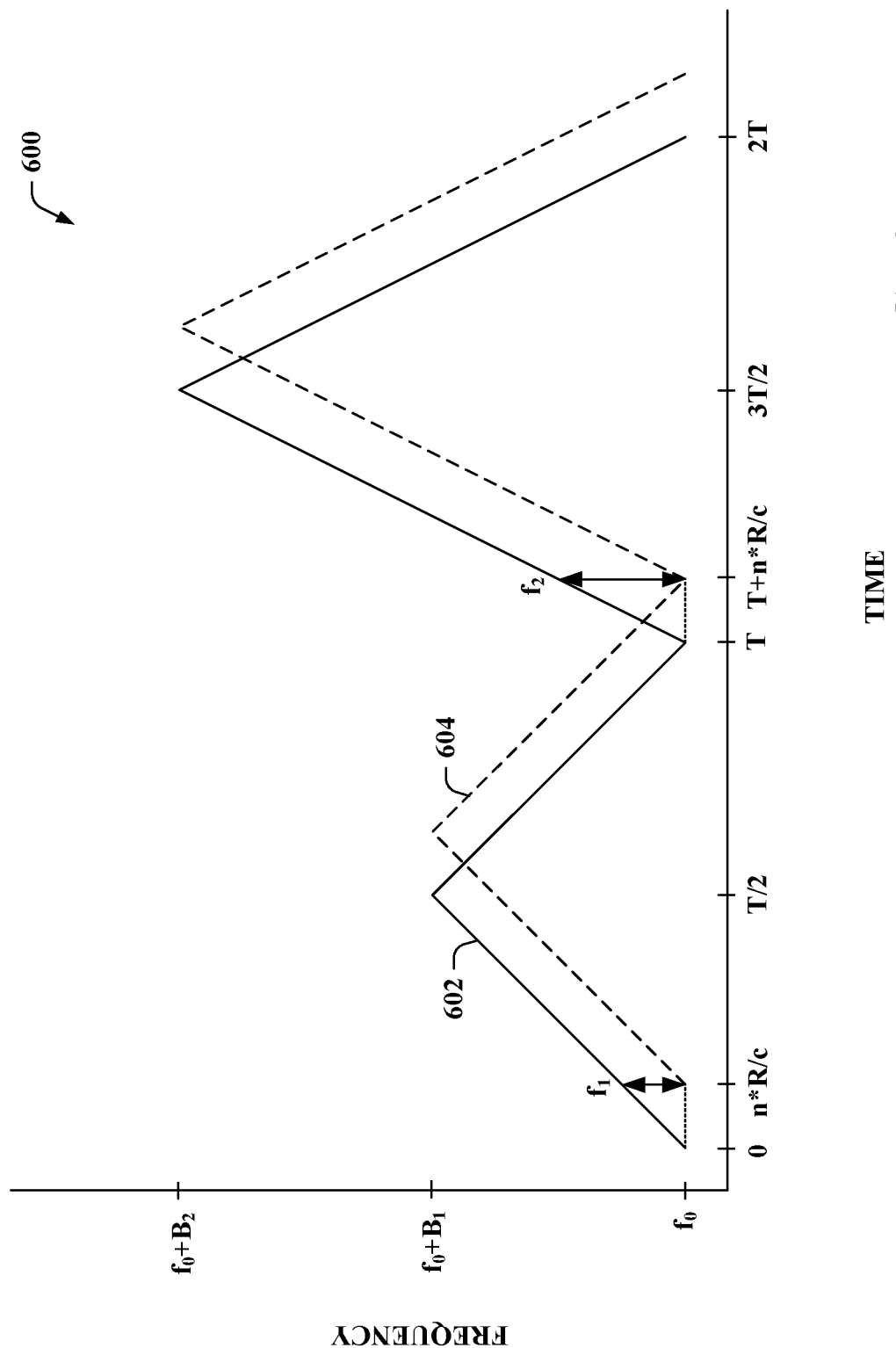
FIGS. 6-8 illustrate various exemplary chirps of a frequency modulated optical signal generated by a laser source optically injection locked to an optical resonator of the testing apparatus.
Figure 7:
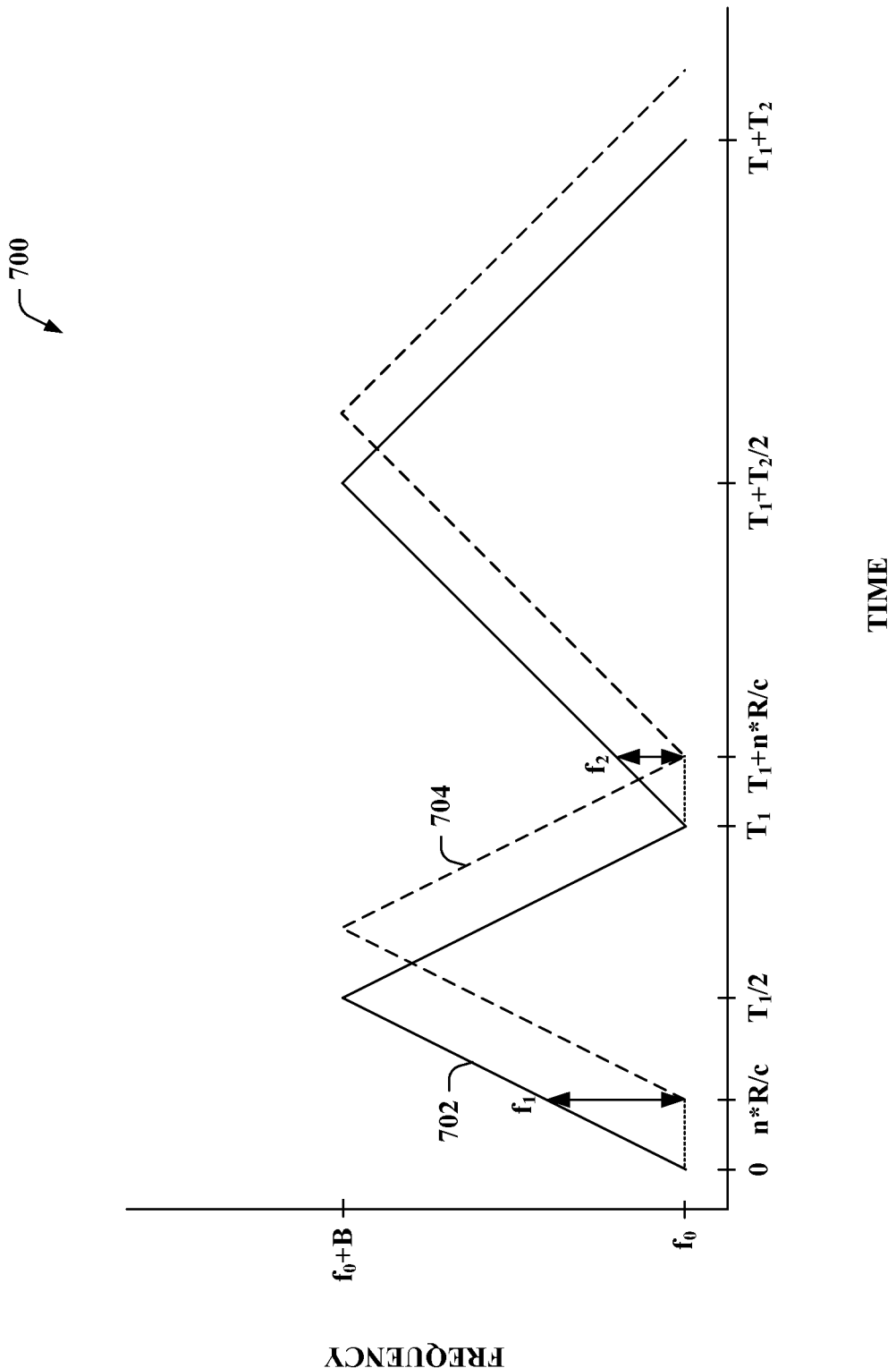
Figure 8:
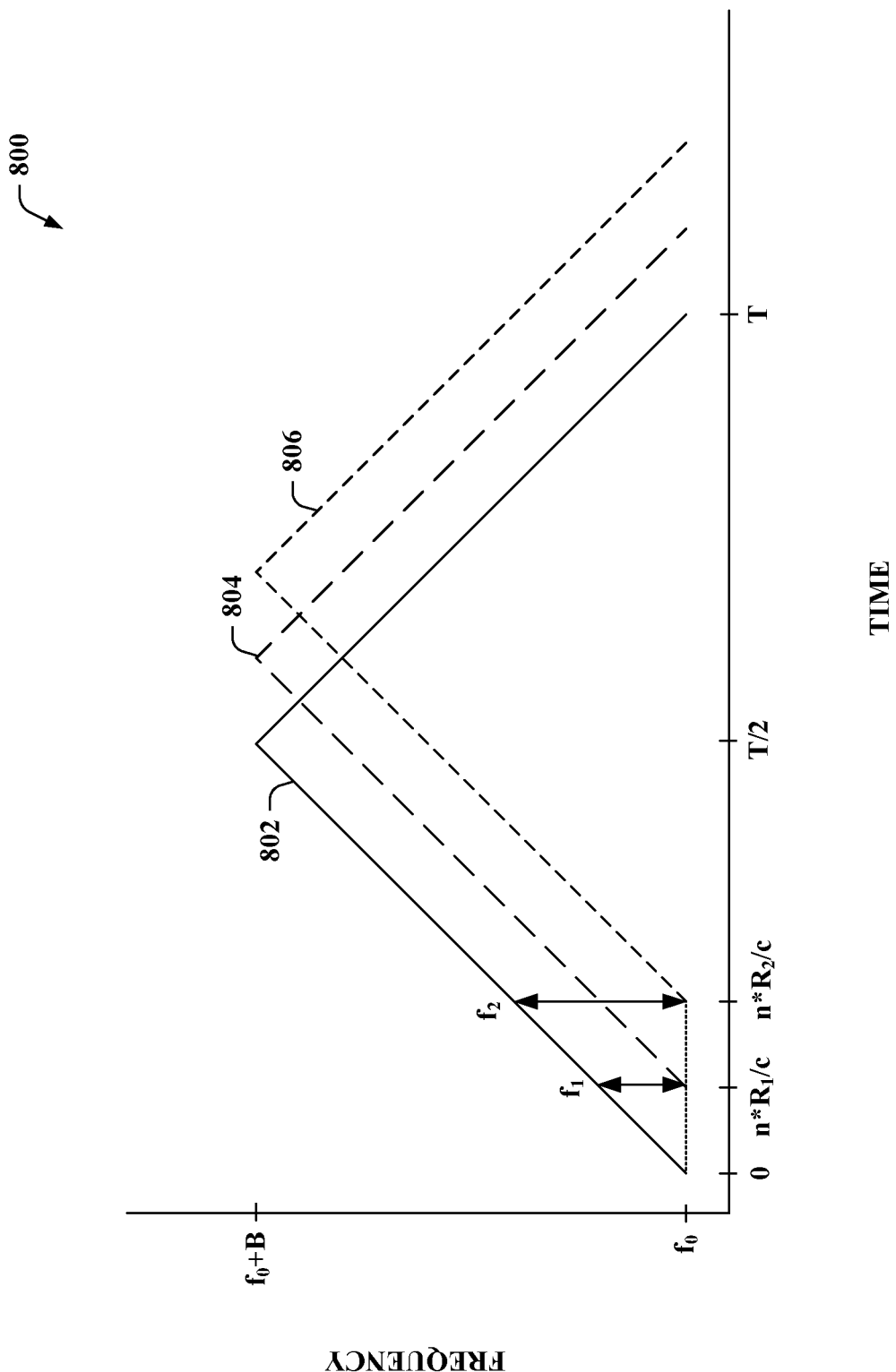

FIGS. 6-8 illustrate various exemplary chirps of the frequency modulated optical signal generated by the laser source 102 optically injection locked to the optical resonator 104. These examples are intended to depict how changes between chirps can cause the interferometer 108 to output different frequencies in the optical test signal (e.g., beat frequencies resulting from combining a portion of a frequency modulated optical signal with a delayed portion of the frequency modulated optical signal). Yet, it is to be appreciated that the claimed subject matter is not limited to the depicted examples.

Now referring to FIG. 6, illustrated is a chart 600 depicting a first portion of a frequency modulated optical signal 602 and a delayed second portion of the frequency modulated optical signal 604. More particularly, 602 represents a first portion of the frequency modulated optical signal as received at an output (e.g., the second beam splitter 204) that has propagated through the first optical path 206. Moreover, 604 represents a second portion of the frequency modulated optical signal as received at the output that has propagated through the second optical path 210 (e.g., one of the optical delay paths 208). Receipt of the second portion 604 at the second beam splitter 204 is delayed relative to receipt of the first portion 602. Further, $$\frac{n * R}{c}$$

is a time delay between receipt of the first portion 602 and the second portion 604. As set forth below, R is a physical path difference between a length of the second optical path and a length of the first optical path, c is the speed of light, and n is the index of refraction of the interferometer 108.

The first portion 602 and the second portion 604 are combined (e.g., coherently interfere, at the second beam splitter 204), resulting in the interferometer 108 outputting the optical test signal that is representative of beat frequencies over time (e.g., a carrier frequency of the laser source 102 is removed by combining the first portion 602 and the second portion 604).

In the example depicted in FIG. 6, a linear modulation scheme is used to generate triangular chirps as part of the frequency modulated optical signal, each with a period T (e.g., two chirps are shown). A first waveform of a time-varying voltage applied by the modulator 106 to the optical resonator 104 (e.g., time 0 to time T) can cause the laser source 102 optically injection locked to the optical resonator 104 to generate the first chirp, and a second waveform of the time-varying voltage applied by the modulator 106 to the optical resonator 104 (e.g., time T to time 2T) can cause the laser source 102 optically injection locked to the optical resonator 104 to generate the second chirp. A first voltage change of the first waveform differs from a second voltage change of the second waveform. In the example of FIG. 6, the second voltage change is greater than the first voltage change resulting in bandwidth $B_2$ of the second chirp being greater than bandwidth $B_1$ of the first chirp (e.g., due to the frequency of the beam emitted by the laser source 102 optically injection locked to the optical resonator 104 being proportional to the voltage applied to the optical resonator 104).

$f_0$ is the carrier frequency of the laser source 102. In the example shown, the first chirp can have a first slope $$\xi_1 = \frac{2B_1}{T}$$

and the second chirp can have a second slope $$\xi_2 = \frac{2B_2}{T}.$$

Moreover, a beat frequency f is related to the slope $\xi$ of a chirp as follows:

$$f = \frac{n*R}{c}\xi.$$

R is a physical path difference between a length of the second optical path and a length of the first optical path, c is the speed of light, n is the index of refraction of the interferometer, and is a slope of a chirp. It follows that n*R is an optical path difference between the second optical path and the first optical path. Thus, the beat frequency f has a linear relationship that is proportional to the slope of the chirp $\xi$. Accordingly, a beat frequency $f_1$ of the first chirp is $$f_1 = \frac{n*R}{c}\xi_1$$

and a beat frequency $f_2$ of the second chirp is $$f_2 = \frac{n*R}{c}\xi_2.$$

In view of the foregoing, modulating the voltage change between chirps (e.g., in a continuous manner) can result in the optical test signal having a range of frequencies.

Turning to FIG. 7, illustrated is a chart 700 depicting a first portion of a frequency modulated optical signal 702 and a delayed second portion of the frequency modulated optical signal 704. Similar to above, 702 represents a first portion of the frequency modulated optical signal as received at an output (e.g., the second beam splitter 204) that has propagated through the first optical path 206. Further, 704 represents a second portion of the frequency modulated optical signal as received at the output that has propagated through the second optical path 210 (e.g., one of the optical delay paths 208). Receipt of the second portion 704 at the second beam splitter 204 is delayed relative to receipt of the first portion 702

$$\left(\text{e.g., } \frac{n*R}{c}\right)$$

is a time delay between receipt of the first portion 702 and the second portion 704). The first portion 702 and the second portion 704 are combined (e.g., coherently interfere, at the second beam splitter 204), resulting in the interferometer 108 outputting the optical test signal that is representative of beat frequencies over time.

In the example of FIG. 7, triangular chirps having differing periods are generated (e.g., two chirps are shown). A first waveform of a time-varying voltage applied by the modulator 106 to the optical resonator (e.g., time 0 to time $T_1$) can cause the laser source 102 optically injection locked to the optical resonator 104 to generate the first chirp, and a second waveform of the time-varying voltage applied by the modulator 106 to the optical resonator 104 (e.g., time $T_1$ to time $T_1+T_2$) can cause the laser source 102 optically injection locked to the optical resonator 104 to generate the second chirp. A first period of the first waveform $T_1$ differs from a second period of the second waveform $T_2$. As shown in FIG. 7, the second period T2 is greater than the first period T1. Moreover, bandwidth B of the first and second chirps is substantially similar in this example (e.g., the first waveform and the second waveform can have a substantially similar voltage change during the respective time periods). Thus, in the example of FIG. 7, the first chirp can have a first slope $$\xi_1 = \frac{2B}{T_1}$$

and the second chirp can have a second slope $$\xi_2 = \frac{2B}{T_2}.$$

Similar to above, a beat frequency $f_1$ of the first chirp is $$f_1 = \frac{n*R}{c}\xi_1$$

and a beat frequency $f_2$ of the second chirp is $$f_2 = \frac{n*R}{c}\xi_2.$$

In view of the foregoing, modulating the period between chirps can result in the optical test signal having a range of frequencies.

With reference to FIG. 8, illustrated is a chart depicting a first portion of a frequency modulated optical signal 802 and two delayed portions of the frequency modulated optical signal, namely, a delayed portion 804 and a delayed portion 806. More particularly, 802 represents a first portion of the frequency modulated optical signal as received at an output (e.g., the second beam splitter 204) that has propagated through the first optical path 206. Further, the delayed portion 804 represents a second portion of the frequency modulated optical signal as received at the output having propagated via a first optical delay path (e.g., from the optical delay paths 208) and the delayed portion 806 represents the second portion of the frequency modulated optical signal as received at the output having propagated via a second optical delay path (e.g., from the optical delay paths 208). As depicted, different beat frequencies result depending upon which optical delay path of a variable delay interferometer is used.

As shown, if the second portion of the frequency modulated optical signal propagates via the first optical delay path having a length $R_1$, then a beat frequency $f_1$ resulting from a chirp can be $$f_1 = \frac{n*R_1}{c}\xi.$$

Alternatively, if the second portion of the frequency modulated optical signal propagates via the second optical delay path having a length $R_2$, then a beat frequency $f_2$ resulting from a chirp can be $$f_2 = \frac{n*R_2}{c}\xi.$$

Similarly, if the optical delay paths are fibers formed of different materials, then the speed of light c in such fibers can differ, which can lead to different beat frequencies.

Reference is generally made again to FIGS. 6-8. It is to be appreciated that a combination of the techniques set forth in these examples can be utilized (e.g., both period and voltage change used to generate chirps can be altered over time).

Figure 9:
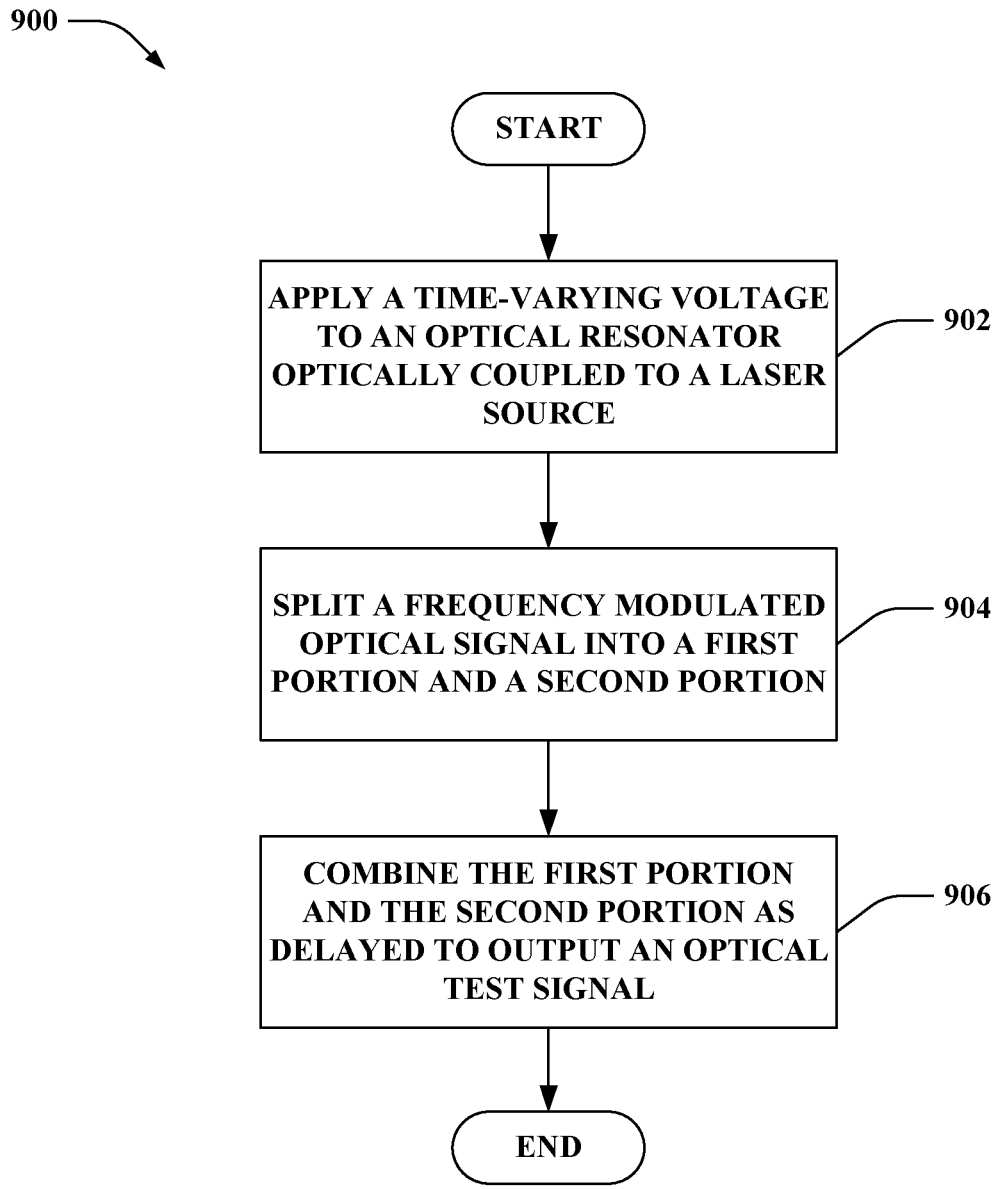
FIG. 9 is a flow diagram that illustrates an exemplary methodology of generating an optical test signal for analyzing an analog frequency response of a device under test.

FIG. 9 illustrates an exemplary methodology relating to generating an optical test signal for analyzing an analog frequency response of a device under test. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

FIG. 9 illustrates a methodology 900 for generating an optical test signal. At 902, a time-varying voltage can be applied to an optical resonator that is optically coupled to a laser source. The laser source is optically injection locked to the optical resonator. The time-varying voltage causes the laser source optically injection locked to the optical resonator to generate a frequency modulated optical signal. Moreover, the frequency modulated optical signal comprises time-varying chirps. At 904, the frequency modulated optical signal can be split into a first portion of the frequency modulated optical signal and a second portion of the frequency modulated optical signal. The first portion of the frequency modulated optical signal propagates via a first optical path and the second portion of the frequency modulated optical signal propagates via a delayed second optical path. At 906, the first portion of the frequency modulated optical signal and the second portion of the frequency modulated optical signal as delayed can be combined to output the optical test signal.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A testing apparatus, comprising:
a housing, comprising:
a laser source;
an optical resonator that is optically coupled to the laser source, the optical resonator being formed of an electrooptic material, wherein the laser source is optically injection locked to the optical resonator;
a modulator configured to apply a time-varying voltage to the optical resonator, the time-varying voltage controls modulation of an optical property of the electrooptic material to cause the laser source optically injection locked to the optical resonator to generate a frequency modulated optical signal, the frequency modulated optical signal comprises time-varying chirps; and
an interferometer configured to receive the frequency modulated optical signal from the laser source optically injection locked to the optical resonator, the interferometer further configured to output an optical test signal having a range of frequencies, the frequencies in the optical test signal being based at least in part on the time-varying chirps;
wherein the testing apparatus is configured to be coupled to a device under test that is separate from the housing such that an outputted test signal is outputted from the housing of the testing apparatus and inputted to the device under test to enable analysis of an analog frequency response of the device under test.

2. The testing apparatus of claim 1, the interferometer being a variable delay interferometer, the frequencies in the optical test signal further being based on a propagation delay of a portion of the frequency modulated optical signal caused by the variable delay interferometer.

3. The testing apparatus of claim 2, the variable delay interferometer comprises a fiber, the portion of the frequency modulated optical signal propagates through the fiber, and the propagation delay is based on a length of the fiber.

4. The testing apparatus of claim 2, the variable delay interferometer comprises a fiber, the portion of the frequency modulated optical signal propagates through the fiber, and the propagation delay is based on a type of material from which the fiber is formed.

5. The testing apparatus of claim 1, wherein the outputted test signal is the optical test signal, and wherein the optical test signal is outputted from the housing of the testing apparatus such that the optical test signal is operable to be inputted to the device under test.

6. The testing apparatus of claim 1, the housing further comprising:
a signal converter configured to receive the optical test signal from the interferometer, the signal converter further configured to convert the optical test signal to an electrical test signal, wherein the outputted test signal is the electrical test signal, and wherein the electrical test signal is outputted from the housing of the testing apparatus such that the electrical test signal is operable to be inputted to the device under test.

7. The testing apparatus of claim 1, the housing further comprising:
a signal converter configured to receive the optical test signal from the interferometer, the signal converter further configured to convert the optical test signal to an electrical test signal; and
an output controller configured to cause the testing apparatus to switch between outputting the optical test signal and the electrical test signal as the outputted test signal outputted from the housing of the testing apparatus.

8. The testing apparatus of claim 1, wherein:
a first waveform of the time-varying voltage applied by the modulator to the optical resonator causes the laser source optically injection locked to the optical resonator to generate a first chirp of the time-varying chirps;
a second waveform of the time-varying voltage applied by the modulator to the optical resonator causes the laser source optically injection locked to the optical resonator to generate a second chirp of the time-varying chirps; and
a first voltage change of the first waveform differs from a second voltage change of the second waveform.

9. The testing apparatus of claim 1, wherein:
a first waveform of the time-varying voltage applied by the modulator to the optical resonator causes the laser source optically injection locked to the optical resonator to generate a first chirp of the time-varying chirps;
a second waveform of the time-varying voltage applied by the modulator to the optical resonator causes the laser source optically injection locked to the optical resonator to generate a second chirp of the time-varying chirps; and
a first period of the first waveform differs from a second period of the second waveform.

10. The testing apparatus of claim 1, the interferometer further comprises:
a first beam splitter configured to split the frequency modulated optical signal into a first portion of the frequency modulated optical signal and a second portion of the frequency modulated optical signal;
a second beam splitter;
a first optical path between the first beam splitter and the second beam splitter, the first portion of the frequency modulated optical signal propagates from the first beam splitter to the second beam splitter via the first optical path; and
a second optical path between the first beam splitter and the second beam splitter, the second portion of the frequency modulated optical signal propagates from the first beam splitter to the second beam splitter via the second optical path such that receipt of the second portion of the frequency modulated optical signal at the second beam splitter is delayed relative to receipt of the first portion of the frequency modulated optical signal at the second beam splitter;
wherein the second beam splitter is configured to combine the first portion of the frequency modulated optical signal and the second portion of the frequency modulated optical signal as delayed to output the optical test signal.

11. The testing apparatus of claim 10, the interferometer being a variable delay interferometer that comprises a plurality of fibers of different lengths, wherein the second optical path is a particular fiber from the plurality of fibers.

12. The testing apparatus of claim 10, the interferometer being a variable delay interferometer that comprises a plurality of fibers formed of differing types of materials, wherein the second optical path is a particular fiber from the plurality of fibers.

13. The testing apparatus of claim 10, wherein the second beam splitter is a 2 by 2 beam splitter configured to split the optical test signal into a first portion of the optical test signal and a second portion of the optical test signal.

14. The testing apparatus of claim 1, the optical resonator is a whispering gallery mode (WGM) resonator.

15. The testing apparatus of claim 1, the housing further comprising a variable attenuator having a controllable loss that enables analyzing a property of the device under test coupled to the testing apparatus.

16. A testing apparatus, comprising:
a housing, comprising:
a laser source;
an optical resonator that is optically coupled to the laser source, the optical resonator being formed of an electrooptical material, wherein the laser source is optically injection locked to the optical resonator;
a modulator configured to apply a time-varying voltage to the optical resonator, the time-varying voltage causes the laser source optically injection locked to the optical resonator to generate a frequency modulated optical signal; and
a variable delay interferometer configured to receive the frequency modulated optical signal from the laser source optically injection locked to the optical resonator, the variable delay interferometer comprises:
a first beam splitter configured to split the frequency modulated optical signal into a first portion of the frequency modulated optical signal and a second portion of the frequency modulated optical signal;
a second beam splitter;
a first optical path between the first beam splitter and the second beam splitter, the first portion of the frequency modulated optical signal propagates from the first beam splitter to the second beam splitter via the first optical path; and a second optical path between the first beam splitter and the second beam splitter, the second portion of the frequency modulated optical signal propagates from the first beam splitter to the second beam splitter via the second optical path such that receipt of the second portion of the frequency modulated optical signal at the second beam splitter is delayed relative to receipt of the first portion of the frequency modulated optical signal at the second beam splitter;

wherein the second beam splitter is configured to combine the first portion of the frequency modulated optical signal and the second portion of the frequency modulated optical signal as delayed to output an optical test signal;

wherein the testing apparatus is configured to be coupled to a device under test that is separate from the housing such that an outputted test signal is outputted from the housing of the testing apparatus and inputted to the device under test to enable analysis of an analog frequency response of the device under test.

17. The testing apparatus of claim 16, the variable delay interferometer comprises a plurality of fibers of different lengths, wherein the second optical path is a particular fiber from the plurality of fibers.

18. The testing apparatus of claim 16, the variable delay interferometer comprises a plurality of fibers formed of differing types of materials, wherein the second optical path is a particular fiber from the plurality of fibers.

19. The testing apparatus of claim 16, the frequency modulated optical signal comprises time-varying chirps, wherein frequencies in the optical test signal are based at least in part on the time-varying chirps.

20. A method for generating an optical test signal from a testing apparatus, comprising:
applying a time-varying voltage to an optical resonator optically coupled to a laser source, the laser source is optically injection locked to the optical resonator, the time-varying voltage causes the laser source optically injection locked to the optical resonator to generate a frequency modulated optical signal;
splitting the frequency modulated optical signal into a first portion of the frequency modulated optical signal and a second portion of the frequency modulated optical signal, the first portion of the frequency modulated optical signal propagates via a first optical path and the second portion of the frequency modulated optical signal propagates via a delayed second optical path;
combining the first portion of the frequency modulated optical signal and the second portion of the frequency modulated optical signal as delayed to generate the optical test signal; and
outputting the optical test signal from a housing of the testing apparatus, the testing apparatus is configured to be coupled to a device under test that is separate from the housing such that the optical test signal is inputted to the device under test to enable analysis of an analog frequency response of the device under test.

\* \* \* \* \*